(12) United States Patent
Kanada et al.

(10) Patent No.: US 6,451,965 B1
(45) Date of Patent: Sep. 17, 2002

(54) METHOD OF REMOVING LOW MOLECULAR WEIGHT SUBSTANCE FROM POLYIMIDE PRECURSOR OR POLYIMIDE CONTAINING LOW MOLECULAR WEIGHT SUBSTANCE

(75) Inventors: Mitsuhiro Kanada; Takayuki Yamamoto; Amane Mochizuki; Takahiro Fukuoka, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/987,050

(22) Filed: Nov. 13, 2001

(30) Foreign Application Priority Data

Nov. 30, 2000 (JP) ........................................ 2000-365158

(51) Int. Cl.$^7$ ................................................. C08F 6/00
(52) U.S. Cl. ....................................................... 528/480
(58) Field of Search ......................................... 528/480

(56) References Cited

U.S. PATENT DOCUMENTS

| 4,535,100 A | 8/1985 | Krutchen et al. ........... 521/180 |
| 5,804,607 A | 9/1998 | Hedrick et al. | |

FOREIGN PATENT DOCUMENTS

| EP | 0 987 294 A | 3/2000 | |
| EP | 1 085 041 A1 | 3/2001 | |
| JP | 6-322168 | 11/1994 | ............... C08J/9/12 |
| JP | 9-100363 | 4/1997 | ............... C08J/9/04 |
| JP | 10-45936 | 2/1998 | ............... C08J/9/12 |
| JP | 2000-44719 | 2/2000 | ............... C08J/9/26 |

OTHER PUBLICATIONS

Hedrick, James et al. "Templating Nanporosity in Thin–Film Dielectric Insulators" Advanced Materials, vol. 10, No. 13, Sep. 10, 19987, pp. 1049–1053, X000781593.

Search Report from the European Patent Office (mailed Feb. 08, 2002).

Jayaraman, et al, "High $T_g$ Polyimide Nanofoams Derived From Pyromellitic Dianhydride and 1,1–Bis(4–Aminophenyl)1–Phenyl–2, 2, 2–Trifluoromethane", Act, Polymer Preprints 35(1), (1994), pp. 347 & 348.

Lebedeva et al, "Preparation of Porous Polyimides From Self–Assembled Graft Copolymers", Act, Polymer Preprints 40 (1), (1999), pp. 494 & 495.

*Primary Examiner*—Terressa M. Boykin
(74) *Attorney, Agent, or Firm*—Sughrue Mion, PLLC

(57) ABSTRACT

A method of efficiently removing a low molecular weight substance from a polyimide precursor or polyimide in which the low molecular weight substance is dispersed as microdomains, without using a large amount of an organic solvent. The method of removing a low molecular weight substance comprises subjecting either a polymer composition having a micro-domain structure made up of a continuous phase comprising a polyimide precursor and, dispersed therein, a discontinuous phase comprising a low molecular weight substance or a polyimide composition obtained from the polymer composition by converting the polyimide precursor into a polyimide to extraction with a combination of supercritical carbon dioxide and a co-solvent to thereby remove the low molecular weight substance. The co-solvent is preferably an aprotic polar solvent, more preferably a nitrogen compound solvent or a sulfur compound solvent.

19 Claims, No Drawings

METHOD OF REMOVING LOW MOLECULAR WEIGHT SUBSTANCE FROM POLYIMIDE PRECURSOR OR POLYIMIDE CONTAINING LOW MOLECULAR WEIGHT SUBSTANCE

FIELD OF THE INVENTION

The present invention relates to a method of removing a low molecular weight substance by extraction from a polyimide precursor or polyimide in which the low molecular weight substance is dispersed as micro-domains and to processes for producing a porous polyimide by utilizing the method. This porous polymer is extremely useful as, for example, circuit substrates for electronic appliances, etc.

DESCRIPTION OF THE RELATED ART

Polyimide resins have conventionally been used widely as parts or members required to have reliability, such as circuit substrates for electronic/electrical appliances and other electronic parts, because of their features such as high insulating properties, dimensional stability, moldability, and light weight properties. Especially in recent years, there is a desire for higher-speed information transmission with the trend toward performance and function advancement in electrical/electronic appliances, and members for use in these appliances also are required to be compatible with the desired higher-speed information transmission. The polyimide resins for use in such applications are also required to have a lower dielectric constant as an electrical property necessary for the use of higher frequencies.

In general, the dielectric constant of a plastic material is determined by the molecular skeleton thereof. This means that a technique which may be effective in reducing dielectric constant is to modify a molecular skeleton. However, in view of the fact that the dielectric constants of polyethylene and polytetrafluoroethylene, which are regarded as low dielectric constant polymers, are about 2.3 and about 2.1, respectively, there are limitations in the technique of controlling dielectric constant based on skeleton modifications. In addition, the above technique poses problems, for example, that a skeleton modification results in changes in properties such as film strength and coefficient of linear expansion.

As other attempts to obtain a lower dielectric constant, various techniques have been proposed in which a plastic material is made porous so as to utilize air, which has a dielectric constant of 1, and to reduce and control the dielectric constant of the plastic material based on the porosity.

Conventional techniques for obtaining general porous polymers include dry processes and wet processes. Conventional dry processes include a physical foaming method and a chemical foaming method. In the physical foaming method, a low boiling solvent is dispersed as a blowing agent into a polymer and this polymer is then heated to volatilize the blowing agent, whereby cells are formed to obtain a porous object. In the chemical foaming method, a blowing agent is added to a polymer and then pyrolyzed to generate a gas, whereby cells are formed to obtain a porous object. However, these techniques have problems, for example, that a sufficiently small cell size cannot be obtained and there are limitations on the formation of finer patterns in circuit formation.

The present inventors have proposed a novel technique for porosity impartation. This technique comprises preparing a solution of a polyimide precursor in a solvent, adding thereto a dispersible low molecular weight substance having an average molecular weight of, e.g., 10,000 or lower, subsequently drying the resulting mixture to remove the solvent and thereby cause a phase separation between the polyimide precursor and the low molecular weight substance, and then conducting a heat treatment to convert the polyimide precursor into a polyimide and thereby obtain a porous polyimide.

However, not only the low molecular weight substance added for forming the two-phase structure but also the residual solvent are present in the dried polyimide precursor and in the polyimide to which the polyimide precursor has been converted. It is therefore necessary to remove these substances from the polyimide precursor and polyimide.

For removing the low molecular weight substance or residual solvent from the polyimide precursor or polyimide, there may be used a method in which the precursor or polyimide is dried at high temperature for a prolonged time period to volatilize the low molecular weight substance, a method in which the precursor or polyimide is heated at high temperature for a prolonged time period to pyrolyze the low molecular weight substance, or a method in which the precursor or polyimide is sufficiently washed with a low boiling solvent, e.g., THF (tetrahydrofuran), and then vacuum-dried for a prolonged time period. However, these methods have a drawback from the standpoint of production process because of the necessity of a prolonged time period and further pose an environmental problem because of the use of a large amount of an organic solvent. With respect to the removal of oligomers having a relatively high molecular weight of 1,000 or above, there has been no technique proved to be effective in this purpose.

SUMMARY OF THE INVENTION

One object of the invention is to provide a method of efficiently removing a low molecular weight substance from a polyimide precursor or polyimide in which the low molecular weight substance is dispersed as micro-domains, without using a large amount of an organic solvent.

Another object of the invention is to provide processes by which a porous polyimide having a small cell size and a low dielectric constant can be efficiently produced.

The present inventors made investigations in order to overcome the problems described above. As a result, they have found that when a dispersible low molecular weight substance for forming a discontinuous phase is added to a polyimide precursor serving as a continuous phase to form a specific micro-domain structure in the polymer and is subsequently removed therefrom by extraction with a combination of supercritical carbon dioxide and a co-solvent, then a porous object having extremely fine cells and a low dielectric constant can be obtained. The invention is based on this finding.

The invention provides a method of removing a low molecular weight substance which comprises subjecting either a polymer composition having a micro-domain structure made up of a continuous phase comprising a polyimide precursor and, dispersed therein, a discontinuous phase comprising a low molecular weight substance or a polyimide composition obtained from the polymer composition by converting the polyimide precursor into a polyimide to extraction with a combination of supercritical carbon dioxide and a co-solvent to thereby remove the low molecular weight substance. The co-solvent is preferably an aprotic polar solvent, and is more preferably a nitrogen compound solvent such as, e.g., N-methyl-2-pyrrolidone or N,N- dimethylacetamide or a sulfur compound solvent. Examples of the low molecular weight substance include monomers or oligomers each having a molecular weight of 10,000 or lower.

The invention further provides a process for producing a porous polyimide which comprises subjecting a polymer composition having a micro-domain structure made up of a continuous phase comprising a polyimide precursor and, dispersed therein, a discontinuous phase comprising a low molecular weight substance to extraction with a combination of supercritical carbon dioxide and a co-solvent to thereby remove the low molecular weight substance, and then converting the polyimide precursor in to a polyimide.

The invention furthermore provides a process for producing a porous polyimide which comprises subjecting a polyimide composition obtained from a polymer composition having a micro-domain structure made up of a continuous phase comprising a polyimide precursor and, dispersed therein, a discontinuous phase comprising a low molecular weight substance by converting the polyimide precursor into a polyimide to extraction with a combination of supercritical carbon dioxide and a co-solvent to thereby remove the low molecular weight substance.

DETAILED DESCRIPTION OF THE INVENTION

The polyimide precursor to be used in the invention is not particularly limited as long as it is an intermediate convertible into a polyimide. It can be obtained by conventional methods. For example, the polyimide precursor can be obtained by reacting an organic tetracarboxylic dianhydride with a diamino compound (diamine).

Examples of the organic tetracarboxylic dianhydride include pyromellitic dianhydride, 3,3',4,4'-biphenyltetracarboxylic dianhydride, 2,2-bis(2,3-dicarboxyphenyl)-1,1,1,3,3,3-hexafluoropropane dianhydride, 3,3',4,4'-benzophenonetetracarboxylic dianhydride, 2,2-bis(3,4-dicarboxyphenyl) ether dianhydride, and bis(3,4-dicarboxyphenyl) sulfone dianhydride. These organic tetracarboxylic dianhydrides may be used alone or in combination of two or more thereof.

Examples of the diamino compound include m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl) hexafluoropropane, 1,3-bis(4-aminophenoxy)benzene, 1,4-bis(4-aminophenoxy)benzene, 2,4-diaminotoluene, 2,6-diaminotoluene, diaminodiphenylmethane, 4,4'-diamino-2,2'-dimethylbiphenyl, and 2,2-bis(trifluoromethyl)-4,4'-diaminobiphenyl. These diamino compounds may be used alone or in combination of two or more thereof.

The polyimide precursor can be obtained by reacting an organic tetracarboxylic dianhydride with a diamino compound (diamine) usually in an organic solvent at from 0 to 90° C. for from 1 to 24 hours. Examples of the organic solvent include polar solvents such as N-methyl-2-pyrrolidone, N,N-dimethylacetamide, N,N-dimethylformamide, and dimethyl sulfoxide. Also usable as the polyimide precursor is a poly(amic acid) silyl ester obtained by reacting an organic tetracarboxylic dianhydride with an N-silylated diamine.

The low molecular weight substance to be used in the invention for constituting the discontinuous phase in the micro-domain structure is an ingredient which is dispersible upon mixing with the polyimide precursor. More specifically, the low molecular weight substance is a compound which is capable of separating as fine particles from the polyimide precursor to form a sea-island micro-domain structure.

Examples of the low molecular weight substance include monomers and oligomers having a relatively low degree of polymerization formed by polymerizing one monomer or two or more different monomers. Hereinafter, monomers and oligomers are often referred to inclusively as "oligomer compounds". Specific examples thereof include polyacrylate oligomer compounds, polyether oligomer compounds, polyester oligomer compounds, and polyurethane oligomer compounds.

Examples of the polyacrylate oligomer compounds include hexanediol di(meth)acrylate, neopentyl glycol di(meth)acrylate, trimethylolpropane tri(meth)acrylate, dipentaerythritol hexa(meth)acrylate, epoxy (meth)acrylates, and oligoester (meth)acrylates.

Examples of the polyether oligomer compounds include polyalkylene glycols such as polyethylene glycol, polypropylene glycol, and polybutylene glycol and such polyalkylene glycols terminated at one or both ends by an alkyl group such as methyl, an alkenyl group such as allyl, an aryl group such as phenyl, or an acyl group such as (meth)acryloyl or by a combination of these.

Examples of the polyester oligomer compounds include ε-caprolactone, polycaprolactone oligomers, and such oligomers terminated at one or both ends by an alkyl group such as methyl, an alkenyl group such as allyl, an aryl group such as phenyl, or an acyl group such as (meth)acryloyl or by a combination of these.

Examples of the polyurethane oligomer compounds include urethane polyols which are products of the reaction of a high molecular weight polyol such as a polyether polyol, polyester polyol, polycarbonate polyol, or polybutadiene polyol with a polyisocyanate monomer; and urethane acrylates which are products of the reaction of a hydroxy (meth)acrylate monomer such as hydroxyethyl (meth)acrylate, phenyl glycidyl ether acrylate, pentaerythritol triacrylate, or glycerol dimethacrylate with a polyisocyanate monomer such as methylene diisocyanate or with any of the urethane polyols shown above.

Those low molecular weight substances may be used alone or in combination of two or more thereof. Such low molecular weight substances have a molecular weight (weight average molecular weight) of preferably 10,000 or lower, e.g., from 100 to 10,000, more preferably about from 200 to 3,000. If a low molecular weight substance having a weight average molecular weight lower than 100 is used, there are cases where the low molecular weight substance is completely compatibilized with the polyimide precursor, making it impossible to obtain a porous object. On the other hand, if a low molecular weight substance having a weight average molecular weight exceeding 10,000 is used, there are cases where the removal thereof in a later step is difficult.

The polymer composition having a micro-domain structure in the invention can be formed by the conventional technique. For example, the polyimide precursor and the low molecular weight substance in a given proportion are dissolved in a solvent (usually, an organic solvent) and this polyimide precursor solution is formed into a desired shape, e.g., a film, by application to a substrate. Thereafter, the solvent is removed by drying to thereby insolubilize the low molecular weight substance in the polyimide precursor. Thus, a polymer composition can be obtained which has a micro-domain structure comprising a continuous phase made of the polyimide precursor and a discontinuous phase dispersed therein.

The amount of the low molecular weight substance to be added can be suitably selected according to the combination of the low molecular weight substance and the polymer. It is generally 200 parts by weight or smaller (e.g., from 5 to 200 parts by weight), preferably 150 parts by weight or smaller (e.g., from 10 to 150 parts by weight), per 100 parts by weight of the polyimide precursor.

The polyimide precursor is formed into, for example, a film by application to a substrate. For applying the polyimide precursor, a known means for coating, such as a spin coater, bar coater, gravure coater or comma coater, may be used according to the shape and thickness of the substrate. It is preferred to conduct the application in such an amount that the resulting polyimide precursor film after drying has a thickness of from 0.1 to 50 $\mu$m, preferably from 1 to 25 $\mu$m. Improved adhesion can be obtained by priming the surface of the substrate with a silane coupling agent or titanate coupling agent prior to the application.

In drying the coating for removing the solvent, a temperature of generally from 40 to 150° C., preferably from 60 to 100° C., is used according to the kind of the solvent used. If temperature higher than 150° C. is used, there are cases where imidization of the polyimide precursor begins. Upon removal of the solvent by this drying, the low molecular weight substance is insolubilized in the polyimide precursor to thereby form a micro-domain structure. This drying may result in porosity. Even if the polymer constituting the continuous phase and the low molecular weight substance constituting the discontinuous phase react with each other to form bonds during the drying, this poses no problem as long as the discontinuous phase can be removed later. In the polymer composition thus obtained, the low molecular weight substance constituting the discontinuous phase is present. There are cases where part of the solvent also remains therein.

The polyimide composition in the invention can be obtained by converting the polyimide precursor into a polyimide by, for example, subjecting the polymer composition having a micro-domain structure to a dehydrating cyclization reaction. The dehydrating cyclization reaction of the polyimide precursor may be conducted, for example, by heating the precursor to about 300 to 400° C. or by causing a dehydrating-cyclization agent, such as a mixture of acetic anhydride and pyridine, to act on the precursor. In the polyimide composition thus obtained, all or part of the low molecular weight substance remains.

The method for removing the low molecular weight substance constituting the discontinuous phase (or remaining) from the polymer composition containing the polyimide precursor as the continuous phase or from the polyimide composition containing a polyimide as the continuous phase will be explained below.

In the invention, the low molecular weight substance is removed by extraction with a combination of supercritical carbon dioxide and a co-solvent. For this extraction, any temperature not lower than the critical point for supercritical carbon dioxide may be used. However, in the removal of the low molecular weight substance from the polymer composition, wherein the polyimide precursor constitutes the continuous phase, it is preferred to conduct the extraction at a temperature in the range in which imidization of the polyimide precursor does not proceed excessively. As the temperature rises, the solubility of the low molecular weight substance in supercritical carbon dioxide decreases. Consequently, the temperature (extraction temperature) at which the low molecular weight substance is removed with supercritical carbon dioxide is preferably from 32 to 230° C., more preferably from 40 to 200° C.

The pressure of the supercritical carbon dioxide is not particularly limited as long as it is not lower than the critical point for supercritical carbon dioxide. However, it is preferably from 7.3 to 100 MPa, more preferably from 10 to 50 MPa.

The co-solvent is preferably an aprotic polar solvent. Preferred examples of the aprotic polar solvent include nitrogen compound solvents and sulfur compound solvents.

Examples of the nitrogen compound solvents include N-methyl-2-pyrrolidone, 2-pyrrolidone, N,N-dimethylacetamide, N-methylacetamide, acetamide, N,N-dimethylformamide, N-methylformamide, formamide, and N-methylpropionamide.

Examples of the sulfur compound solvents include dimethyl sulfoxide and sulfolane.

Especially preferred of such aprotic polar solvents are N-methyl-2-pyrrolidone and N,N-dimethylacetamide. The amount of those aprotic polar solvents to be added is, for example, preferably from 1 to 30% by volume based on the supercritical carbon dioxide.

The co-solvent may be supplied by the following methods. In one method, the co-solvent and carbon dioxide are metered in terms of volume, pressurized, and then continuously supplied with a constant delivery pump to a pressure vessel containing the polymer composition or polyimide composition having a micro-domain structure. In another method, a given amount of the co-solvent is introduced into the pressure vessel before pressurized supercritical carbon dioxide is introduced thereinto.

The time necessary for extraction varies depending on extraction temperature, extraction pressure, amount of the low molecular weight substance added to the polyimide precursor, and coating thickness. However, the extraction time may be about from 1 to 10 hours.

The extraction may be conducted while keeping the extraction vessel closed (in a state in which the supercritical carbon dioxide and co-solvent introduced and the ingredient extracted are prevented from moving out of the vessel) or while continuously supplying supercritical carbon dioxide and the co-solvent to the extraction vessel with a constant delivery pump or the like.

According to the above-described method of removing a low molecular weight substance, since an extraction operation is conducted with a combination of supercritical carbon dioxide and a co-solvent, the low molecular weight substance constituting the discontinuous phase as well as the residual solvent and the like can be removed in a relatively short period of time. Furthermore, since there is no need of using a large amount of an organic solvent, the method is preferred from the standpoint of environmental preservation. In addition, the method is effective in easily removing oligomers having a relatively high molecular weight and in greatly improving the efficiency of removal of low molecular weight substances.

By the method described above, the low molecular weight substance is removed from the polymer composition containing a polyimide precursor as a continuous phase by extraction with a combination of supercritical carbon dioxide and a co-solvent. Thereafter, the polyimide precursor is converted to a polyimide by the method described above.

Thus, a porous polyimide can be obtained. Furthermore, a porous polyimide can be obtained also by removing the low molecular weight substance from the polyimide composition containing a polyimide as a continuous phase by extraction with a combination of supercritical carbon dioxide and a co-solvent by the method described above. The porous polyimides thus obtained not only have a small cell size and hence an exceedingly reduced dielectric constant but have high heat resistance. The porous objects having these properties are extremely advantageously utilizable as, e.g., an internal insulator, buffering material, or circuit substrate in electronic appliances, etc., while taking advantage of excellent properties possessed by polyimide resins, such as heat resistance and mechanical properties.

As described above, according to the method of the invention for removing a low molecular weight substance, the low molecular weight substance present as a discontinuous phase in a polyimide precursor or polyimide can be efficiently removed because extraction is conducted with a combination of supercritical carbon dioxide and a co-solvent. Even oligomers having a relatively high molecular weight can be removed. This method is advantageous also from an environmental standpoint.

According to the porous polyimide production processes of the invention, a porous polyimide having a small cell diameter and a low dielectric constant can be efficiently obtained.

The invention will be explained below in more detail by reference to Examples and Comparative Example, but the invention should not be construed as being limited by these Examples and Comparative Example in any way.
Method for Determination of Dielectric Constant:

Dielectric constant was determined with HP 4284A Precision LCR Meter, manufactured by Yokogawa-Hewlett-Packard, Ltd.

SYNTHESIS EXAMPLE
Synthesis of Polyimide Precursor

Into a four-necked flask having a capacity of 500 mL equipped with a stirrer and a thermometer were introduced 16.2 g (0.15 mol) of p-phenylenediamine (PDA) and 227 g of N-methyl-2-pyrrolidone (NMP). The contents were stirred at room temperature to obtain a solution. Subsequently, 39.7 g (0.135 mol) of 3,3',4,4'-biphenyltetracarboxylic dianhydride (diphthalic dianhydride; BPDA) and 3.0 g (0.015 mol) of 2,2-bis(3,4-dicarboxyphenyl)hexafluoropropane dianhydride (6FDA) were added to the solution. The resulting mixture was stirred at room temperature for 2 hours to obtain a polyimide precursor solution.

Example 1

A polyethylene glycol monomethyl ether oligomer having a weight average molecular weight of 600 was added to the polyimide precursor solution obtained in the Synthesis Example, in an amount of 66 parts by weight per 100 parts by weight of the polyimide precursor. The resulting mixture was stirred to obtain a transparent homogeneous solution. This solution was applied to a 25 $\mu$m-thick stainless-steel foil (SUS304) with a comma coater in such an amount as to result in a polyimide precursor film having a thickness of 15 $\mu$m on a dry basis. The coating was dried at 95° C. for 5 minutes to remove the solvent and then further heated at 180° C. for 10 minutes to obtain a polyimide precursor film which had a micro-domain structure containing the polyethylene glycol monomethyl ether oligomer.

This polyimide precursor film was cut into a sheet having dimensions of 50 mm by 100 mm. This sheet was placed in a 500 ml pressure vessel, and 50 ml of N,N-dimethylacetamide was introduced thereinto. The pressure vessel was closed, hand supercritical carbon dioxide pressurized to 25 Mpa was introduced thereinto in a 100° C. atmosphere. Thereafter, the pressure and temperature were maintained for 2 hours to conduct supercritical extraction. Throughout this operation, the pressure vessel was kept closed and supercritical carbon dioxide was not passed therethrough.

Subsequently, the pressure inside the pressure vessel was lowered and the polyimide precursor film was taken out. The amount of the low molecular weight substance removed was calculated from the weight change through the extraction. As a result, 100% by weight of the low molecular weight substance was found to have been removed. The matter extracted was analyzed by FT-IR spectroscopy. As a result, the matter removed was found to be the polyethylene glycol monomethyl ether oligomer added to the polyimide precursor.

The polyimide precursor film thus treated was heated to 380° C. at a reduced pressure of 1.33 Pa to obtain a porous polyimide film having a thickness of 10 $\mu$m. The porous polyimide film obtained had a dielectric constant $\epsilon$ of 2.47 (measuring frequency, 1 MHz)

Example 2

A polyimide precursor film was produced in the same manner as in Example 1 above.

This polyimide precursor film was cut into a sheet having dimensions of 50 mm by 100 mm. This sheet was placed in a 500 ml pressure vessel, and 50 ml of N-methyl-2-pyrrolidone was introduced thereinto. The pressure vessel was closed, and supercritical carbon dioxide pressurized to 25 Mpa was introduced thereinto in a 100° C. atmosphere. Thereafter, the pressure and temperature were maintained for 2 hours to conduct supercritical extraction. Throughout this operation, the pressure vessel was kept closed and supercritical carbon dioxide was not passed therethrough.

Subsequently, the pressure inside the pressure vessel was lowered and the polyimide precursor film was taken out. The amount of the low molecular weight substance removed was calculated from the weight change through the extraction. As a result, 100% by weight of the low molecular weight substance was found to have been removed. However, a slight decrease in film thickness was observed.

The polyimide precursor film thus treated was heated to 380° C. at a reduced pressure of 1.33 Pa to obtain a porous polyimide film having a thickness of 10 $\mu$m. This porous polyimide film had a dielectric constant $\epsilon$ of 2.80 (1 MHz).

Comparative Example

A polyimide precursor film was produced in the same manner as in Example 1 above.

This polyimide precursor film was cut into a sheet having dimensions of 50 mm by 100 mm. This sheet was placed in a 500 ml pressure vessel. The pressure vessel was closed without introducing a co-solvent thereinto, and supercritical carbon dioxide pressurized to 25 Mpa was introduced thereinto in a 100° C. atmosphere. Thereafter, the pressure and temperature were maintained for 2 hours to conduct supercritical extraction. Throughout this operation, the pressure vessel was kept closed and supercritical carbon dioxide was not passed therethrough.

Subsequently, the pressure inside the pressure vessel was lowered and the polyimide precursor film was taken out. The amount of the low molecular weight substance removed was calculated from the weight change through the extraction. As a result, only 5.6% by weight of the low molecular weight substance was found to have been removed.

The polyimide precursor film thus treated was heated to 380° C. at a reduced pressure of 1.33 Pa to obtain a porous polyimide film having a thickness of 10 µm. The porous polyimide film obtained had a dielectric constant $\epsilon$ of 3.00 (1 MHz).

What is claimed is:

1. A method of removing a low weight average molecular weight substance from a polymer composition or from a polyimide precursor composition comprising extracting the low weight average molecular weight substance from the composition or from the polyimide precursor composition with a combination of supercritical carbon dioxide and a co-solvent, wherein said polymer composition has a micro-domain structure comprising a continuous phase comprising a polyimide precursor and, dispersed therein, a discontinuous phase comprising a low weight average molecular weight substance and wherein said polyimide composition is obtained from the polymer composition by converting the polyimide precursor into a polyimide.

2. The method of removing a low weight average molecular weight substance of claim 1, wherein said co-solvent is an aprotic polar solvent.

3. The method of removing a low weight average molecular weight substance of claim 1, wherein said co-solvent is a nitrogen compound solvent or a sulfur compound solvent.

4. The method of removing a low weight average molecular weight substance of claim 1, wherein said co-solvent is N-methyl-2-pyrrolidone or N,N-dimethylacetamide.

5. The method of removing a low weight average molecular weight substance of claim 1, wherein said low weight average molecular weight substance is a monomer or an oligomer each having a molecular weight of 10,000 or lower.

6. A process for producing a porous polyimide comprising extracting a low weight average molecular weight substance from a polymer composition with a combination of supercritical carbon dioxide and a co-solvent, and converting the polyimide precursor into a polyimide, wherein said polymer composition has a micro-domain structure comprising a continuous phase comprising a polyimide precursor and, dispersed therein, a discontinuous phase comprising a low weight average molecular weight substance.

7. A process for producing a porous polyimide comprising extracting a low weight average molecular weight substance from a polyimide composition with a combination of supercritical carbon dioxide and a co-solvent, wherein said polyimide composition is obtained from a polymer composition having a micro-domain structure made up of a continuous phase comprising a polyimide precursor and, dispersed therein, a discontinuous phase comprising a low molecular weight substance by converting said polyimide precursor into a polyimide.

8. The method of removing a low weight average molecular weight substance of claim 1, wherein the extracting time is from 1 to 10 hours.

9. The method of removing a low weight average molecular weight substance of claim 1, wherein the extracting is performed at a temperature of from 32 to 230° C.

10. The method of removing a low weight average molecular weight substance of claim 1, wherein the extracting is performed at a temperature of from 40 to 200° C.

11. The method of removing a low weight average molecular weight substance of claim 1, wherein the extracting is performed at a pressure of from 7.3 to 100 MPa.

12. The method of removing a low weight average molecular weight substance of claim 1, wherein the extracting is performed at a pressure of from 10 to 50 MPa.

13. The method of removing a low weight average molecular weight substance of claim 1, wherein said low weight average molecular weight substance has a low weight average molecular weight of from 100 to 10,000.

14. The method of removing a low weight average molecular weight substance of claim 1, wherein said low weight average molecular weight substance has a low weight average molecular weight of from 200 to 3,000.

15. The method of removing a low weight average molecular weight substance of claim 1, wherein said low weight average molecular weight substance are selected from the group consisting of a polyacrylate oligomer compound, a polyether oligomer compound, a polyester oligomer compound, and a polyurethane oligomer compound.

16. The method of removing a low weight average molecular weight substance of claim 1, wherein said low weight average molecular weight substance is selected from the group consisting of hexanediol di(meth)acrylate, neopentyl glycol di(meth)acrylate, trimethylolpropane tri(meth)acrylate, dipentaerythritol hexa(meth)acrylate, epoxy (meth)acrylate, oligoester (meth)acrylate, polyethylene glycol, polypropylene glycol, polybutylene glycol, polyalkylene glycol terminated at one or both ends by an alkyl group, an alkenyl group, an aryl group or an acyl group, $\epsilon$-caprolactone, polycaprolactone oligomers, $\epsilon$-caprolactone and polycaprolactone oligomers terminated at one or both ends by an alkyl group, an alkenyl group, an aryl group, or an acyl group, urethane polyol which is the product of a reaction of a high molecular weight polyol with a polyisocyanate monomer, urethane acrylate which is the products of a reaction of a hydroxy (meth)acrylate monomer with a polyisocyanate monomer or with a urethane polyol.

17. The process for producing a porous polyimide of claim 6, wherein said polyimide precursor is converted into a polyimide by a dehydrating cyclization reaction.

18. The process for producing a porous polyimide of claim 17, wherein said dehydrating cyclization reaction is conducted by heating the precursor to about 300 to 400° C.

19. The process for producing a porous polyimide of claim 17, wherein said dehydrating cyclization reaction is conducted with a mixture of acetic anhydride and pyridine as a dehydrating-cyclization agent.

* * * * *